United States Patent
Schowalter et al.

(10) Patent No.: US 7,323,414 B2
(45) Date of Patent: *Jan. 29, 2008

(54) METHOD FOR POLISHING A SUBSTRATE SURFACE

(75) Inventors: Leo J. Schowalter, Latham, NY (US); Javier Martinez Lopez, Cadiz (ES); Juan Carlos Rojo, East Setauket, NY (US); Kenneth Morgan, Castleton, NY (US)

(73) Assignees: Crystal IS, Inc., Green Island, NY (US); Rensselaer Polytechnic Institute, Troy, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/363,816

(22) Filed: Feb. 28, 2006

(65) Prior Publication Data

US 2007/0289946 A1    Dec. 20, 2007

Related U.S. Application Data

(63) Continuation of application No. 10/300,481, filed on Nov. 20, 2002, now Pat. No. 7,037,838.

(60) Provisional application No. 60/331,868, filed on Nov. 20, 2001.

(51) Int. Cl.
*H01L 21/461* (2006.01)
*H01L 21/302* (2006.01)

(52) U.S. Cl. .............. 438/689; 438/690; 438/691; 438/692; 438/693

(58) Field of Classification Search .............. None
See application file for complete search history.

(56) References Cited

U.S. PATENT DOCUMENTS

| | | | |
|---|---|---|---|
| 3,629,023 A | 12/1971 | Strehlow | |
| 5,478,436 A | 12/1995 | Winebarger et al. | |
| 5,578,523 A * | 11/1996 | Fiordalice et al. | 438/633 |
| 5,597,443 A | 1/1997 | Hempel | |
| 5,645,682 A | 7/1997 | Skrovan | |
| 5,677,231 A | 10/1997 | Maniar et al. | |
| 5,876,508 A | 3/1999 | Wu et al. | |
| 6,063,306 A | 5/2000 | Kaufman et al. | |
| 6,291,351 B1 * | 9/2001 | Li et al. | 438/692 |
| 6,521,535 B2 | 2/2003 | Sabia | |

FOREIGN PATENT DOCUMENTS

| | | |
|---|---|---|
| EP | 0 684 106 A2 | 11/1995 |
| EP | 0 822 164 A2 | 2/1998 |
| EP | 1 041 129 A1 | 10/2000 |
| EP | 1 103 346 A2 | 5/2001 |
| WO | WO 01/58644 A2 | 8/2001 |

* cited by examiner

*Primary Examiner*—Duy-Vu N Deo
(74) *Attorney, Agent, or Firm*—Goodwin Procter LLP

(57) ABSTRACT

According to one aspect of the invention, an improved process for preparing a surface of substrate is provided wherein the surface of the substrate is prepared for a chemical mechanical polishing (CMP) process, the CMP process is performed on the surface of the substrate, and the surface of the substrate is finished to clear the substrate surface of any active ingredients from the CMP process. Also, an improved substrate produced by the method is provided. According to one aspect of the invention, particular polishing materials and procedures may be used that allow for increased quality of AlN substrate surfaces.

16 Claims, 5 Drawing Sheets

METHOD FOR POLISHING A SUBSTRATE SURFACE

RELATED APPLICATIONS

This application is a continuation (CON) of U.S. application Ser. No. 10/300,481 entitled "METHOD FOR POLISHING A SUBSTRATE SURFACE," filed on Nov. 20, 2002, now U.S. Pat. No. 7,037,838, which claims priority under 35 U.S.C. § 119(e) to U.S. Provisional Application Ser. No. 60/331,868, entitled "CHEMICAL MECHANICAL POLISHING (CMP) PROCESS," filed on Nov. 20, 2001, both applications are herein incorporated by reference in their entirety.

FEDERALLY SPONSORED RESEARCH

This invention was made in part with government support under grant number F33615-98-C-1325 from the United States Air Force, Air Force Research Laboratory, and grant numbers N00014-00-M-0160 and N00014-01-C-0232 from the Department of the Navy, Office of Naval Research. The government may have certain rights in this invention.

FIELD OF THE INVENTION

The present invention relates generally to the preparation of semiconductor substrate surfaces, and more specifically to preparing substrate surfaces using chemical mechanical polishing (CMP).

BACKGROUND OF THE INVENTION

Chemical mechanical polishing (CMP) is a process that is used to polish surfaces of semiconductor wafers. In particular, CMP employs both physical and chemical forces to polish wafer surfaces. First, a load force is applied to the back of a wafer while it rests on a polishing pad. Both the pad and the wafer are then counter-rotated while slurry containing both abrasives and reactive chemicals is passed underneath.

CMP is typically used to planarize a surface of a wafer for the purpose of creating an integrated circuit. CMP has emerged as the planarization method of choice because of its ability to planarize over longer lengths than traditional planarization techniques. As discussed, CMP is a combination of a chemical reaction and mechanical action. First, the slurry weakens the wafer surface and the slurry particles, in addition to particles located on the pad, complete material removal from the wafer surface.

It is desired to use aluminum nitride (AlN) as a substrate material for creating commercial semiconductor devices, however, there are problems in processing AlN surfaces to derive substrate surfaces suitable for epitaxial growth. For example, current CMP processes damage the AlN material making it unsuitable for epitaxial growth. It would be beneficial to have an improved method for polishing AlN wafers that produces a quality surface suitable for epitaxial growth.

SUMMARY OF THE INVENTION

One illustrative embodiment of the invention is directed to a method of preparing a surface of a substrate, the method comprising the acts of preparing the surface of the substrate for a chemical mechanical polishing (CMP) process, performing the CMP process on the surface of the substrate, and finishing the surface of the substrate, wherein the act of performing the CMP process further comprises an act of applying an abrasive suspension in a solution during the CMP process. According to one aspect of the invention, a method is provided wherein the substrate is aluminum nitride (AlN).

According to another aspect of the invention, the abrasive suspension in the solution further comprises a silica suspension in a hydroxide (basic) solution. According to another aspect of the invention, the abrasive suspension includes a KOH-based slurry. According to one aspect of the invention, the abrasive suspension in the solution further comprises a silica particles suspended in an ammonia-based slurry.

According to another aspect of the invention, the act of performing the CMP process includes an act of applying the abrasive suspension at a rate of approximately 0.5 mL per minute for a circular 8.0" diameter polishing surface. According to one aspect of the invention, the act of performing the CMP process includes an act of maintaining a polishing speed of the sample in a range of approximately 13 to 18 m/sec.

According to another aspect of the invention, the act of preparing includes cleaning a polishing apparatus prior to polishing the surface of the substrate to substantially reduce contamination of the polishing surface. According to one aspect of the invention, the act of finishing the surface of the substrate includes an act of substantially rinsing the abrasive suspension from the surface of the substrate. According to another aspect of the invention, the method further comprises cleaning, during the preparing acts, the surface of the substrate with a solvent. According to another aspect of the invention, the substrate is an on-axis, Al-polarity, c-face surface, and the abrasive suspension has a pH value of approximately 10.5 or greater. According to another aspect of the invention, an substrate is provided produced by the method. According to another aspect of the invention, a device having a substrate produced by the method is provided.

According to another aspect of the invention, a method is provided for preparing a surface of a substrate. The method comprises acts of preparing the surface of the substrate for a chemical mechanical polishing (CMP) process, the act of preparing comprising acts of determining an orientation of the substrate; and performing a removal of the surface of the substrate based on the orientation. According to another aspect of the invention, the substrate is AlN, and the act of determining an orientation includes an act of determining, for the AlN substrate, at least one face of the AlN substrate and its orientation to the surface to be polished. According to another aspect, the act of performing a removal includes an act of determining a period of removal based on the orientation.

According to another aspect of the invention, the act of performing a removal includes an act of removing exposed off-axis material from the substrate surface. According to another aspect, the act of removing the exposed off-axis material includes removing between 50 and 100 μm of material from the substrate surface.

According to another aspect, the substrate includes a surface normal to be polished, and the act of determining an orientation includes determining, for a given face of the substrate, an orientation of the normal surface with respect to the given face. According to another aspect of the invention, the act of performing a removal of the surface of the substrate based on the orientation of the normal surface with respect to the given face.

According to another aspect, the substrate includes an Al-polarity side of c-face substrate, and the act of performing a removal includes performing at least one of a dry grinding and polishing using a polymer diamond suspension to prepare the Al-polarity side of the c-face substrate. According to another aspect of the invention, the AlN substrate includes a non-polar surface, and the act or performing a removal further comprises an act of removing between 10 and 20 µm of the non-polar surface.

According to another aspect of the invention, the method further comprises an act of performing the chemical mechanical polishing (CMP) process, and a polishing of the substrate surface is performed based on the orientation. According to another aspect, the polishing further comprises an act of polishing the substrate surface with a slurry having a pH value, and the slurry being selected based on the face of the substrate and the pH value.

According to another aspect, the substrate is AlN, and the substrate surface is the on-axis Al-polarity, c-face surface, and the pH value of the selected slurry is greater than 10.5. According to another aspect of the invention, an substrate is provided produced by the method. According to another aspect of the invention, a device having a substrate produced by the method is provided.

Further features and advantages of the present invention as well as the structure and operation of various embodiments of the present invention are described in detail below with reference to the accompanying drawings. In the drawings, like reference numerals indicate like or functionally similar elements. Additionally, the left-most one or two digits of a reference numeral identifies the drawing in which the reference numeral first appears.

BRIEF DESCRIPTION OF THE DRAWINGS

The invention is pointed out with particularity in the appended claims. The above and further advantages of this invention may be better understood by referring to the following description when taken in conjunction with the accompanying drawings in which similar reference numbers indicate the same or similar elements.

In the drawings.

DETAILED DESCRIPTION

Figure 1:
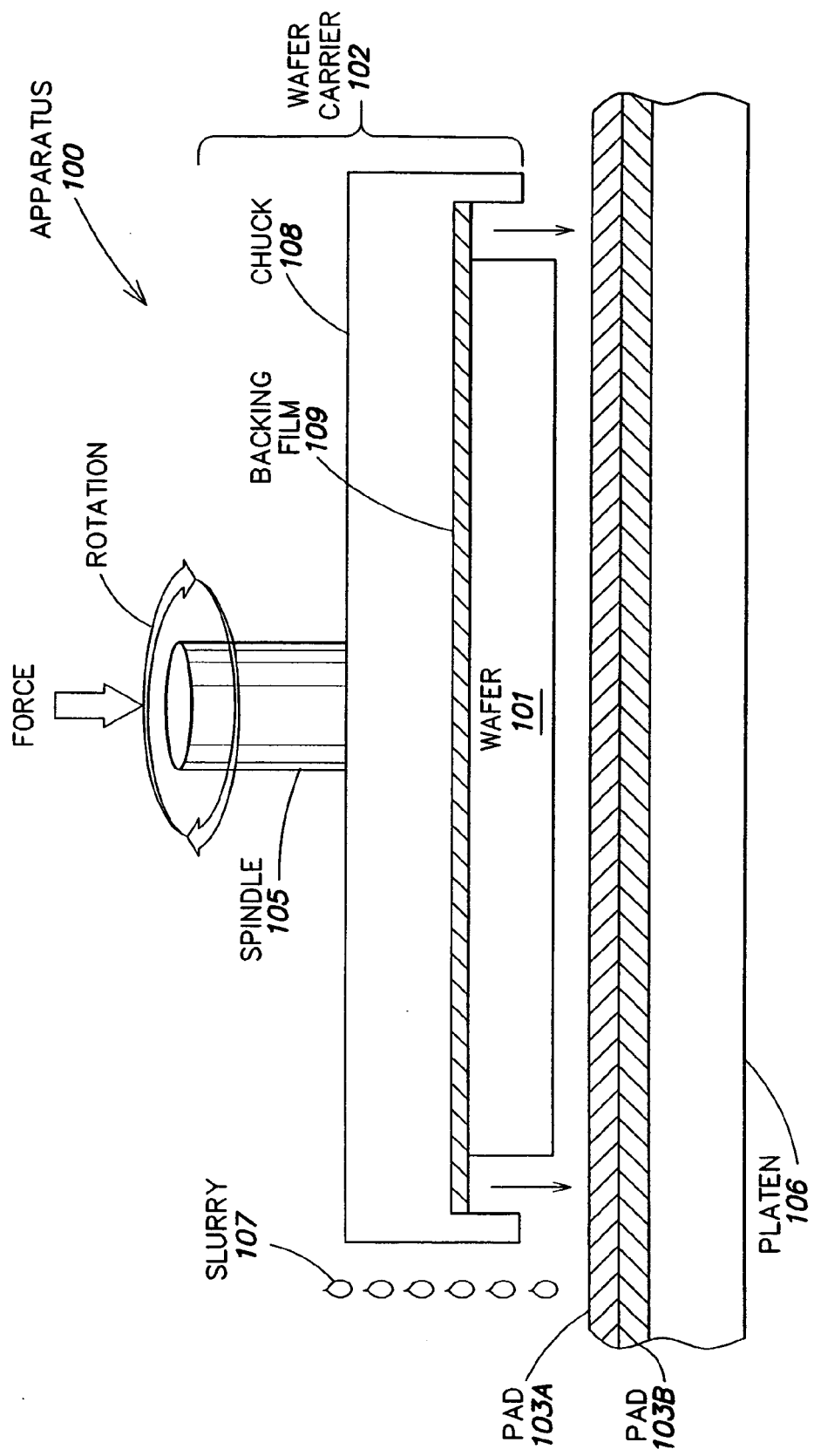
FIG. 1 shows a conventional CMP apparatus that may be used to polish substrate surfaces in a CMP process according to one embodiment of the invention.

The use of single crystal III-nitrides allow improved epitaxial growth, improved thermal and chemical compatibility, as well as improved thermal conductivity. Applications of wide-bandgap and high-temperature semiconductors including the development of blue/UV solid-state charge injection lasers, UV optical sources and detectors, high power microwave devices, high power switches, and high temperature applications. However, there is a need to obtain a method for suitably preparing surfaces of aluminum nitride (AlN) substrates for epitaxial growth to produce these devices. For example, nitrides (e.g. AlN, $Al_x$, $Ga_{(1-x)}N$, etc.) may be epitaxially grown on single crystal AlN substrates by, for example, Organometallic Vapor Phase Epitaxy (OMVPE) and other formation processes.

Device fabrication on AlN substrates generally involves the epitaxial growth of a device layer. The quality of this device layer depends on the quality of the surface of the AlN substrate. Despite the best polishing techniques, the wafer surface can retain polishing defects such as micro-damage and surface roughness. Surface defects are known to effect the quality of finished semiconductors prepared through epitaxial growth. It is believed that conventional polishing procedures damage the AlN surface both at a submicron scale and just under the AlN surface in such a way that the substrate is unsuitable for epitaxial growth. Difficulty arises in preparing such surfaces because the AlN surface is unable to be polished using conventional CMP process without introducing surface defects. Because conventional CMP techniques damage the AlN surface, a method that produces an atomically smooth surface suitable for epitaxial growth for AlN crystals is desired.

According to one aspect of the invention, an improved process for preparing a surface of a substrate is provided wherein the surface of the substrate is prepared for a chemical mechanical polishing (CMP) process, the CMP process is performed on the surface of the substrate, and the surface of the substrate is finished to clear the substrate surface of any active ingredients from the CMP process. Also, an improved substrate produced by the method is provided. According to one aspect of the invention, particular polishing materials and procedures may be used that allow for increased quality of AlN substrate surfaces.

To employ AlN crystals as substrates for epitaxial growth of other compound semiconductors such as GaN, InN, or 2H—SiC, large area, high perfection AlN wafers are needed. After growing AlN boules, the boules are generally cut into wafers using annular diamond saws or wire saws and then the surface of each is ground and polished flat. According to one embodiment of the invention, AlN crystal surfaces (e.g., the a, +c or −c surfaces of AlN) are polished using CMP to derive surfaces suitable for epitaxial growth. Optimally, these polished surfaces are flat, highly perfect surfaces with a minimum of scratches, pits, or damage dislocations and other subsurface damage. Also, these polished surfaces are also free of aluminum oxide coating or islands.

In any grinding process, the powder employed for grinding should have a microhardness greater than or equal to that of the crystal being ground. The basic goal is to remove material from the crystal in a short period of time. The polishing is intended to give a mirror-like finish to the surface, and leave a damage-free crystal underneath. This polishing process is much like "chemical-mechanical-planarization" processes as are known in the art which are used most frequently to planarize wafer surfaces of multilayer devices. In this process, the polishing lubricant actually reacts slowly with the crystal being polished. The slurry and abrasive pad are designed to continuously remove the reaction products without appreciably damaging the underlying crystal.

In CMP, high elevation features of a wafer are selectively removed (i.e., material from high elevation features is removed more rapidly than material at lower elevations), resulting in a surface having an improved planarity.

Mechanical polishing, assisted by chemical action, produces such selective material removal. The process is performed by mounting the wafer face down on a carrier. The carrier is then pressed against the rotating platen containing a polishing pad. The carrier itself is also rotated. An abrasive-containing aqueous slurry is dripped onto the table, saturating the pad. Conventionally, the slurry comprises abrasives of silica, alumina, ceria, or other nanometer-size particles suspended in an alkaline or acidic medium.

According to one aspect of the invention, it is realized that orientation affects mechanical preparation of a substrate surface prior to CMP processing. So-called c-face substrates are produced when the AlN crystal is sliced perpendicular to the c-axis of the crystal. These c-face substrates are polar and the surfaces on the two sides of the substrate will have quite different properties. One side of the substrate is aluminum (Al) terminated (or so-called Al-polarity, c-face) and the other side is nitrogen (N) terminated (or so-called N-polarity, c-face).

When the AlN crystal is cut so that the c-axis of the crystal is contained in the plane of the substrate, a non-polar substrate is produced wherein the two surfaces have identical behavior. Substrates that are cut at some angle away from the c-axis (other than 90°) also demonstrate some polarity effects, but these effects are not as strong as the effects of c-face substrates. C-face substrates are currently being used to produce electronic devices that take advantage of polar effects to create a high-density electron gas without any or with minimal doping. However, optoelectronic devices are expected to be better if non-polar substrates are used.

According to one embodiment of the invention, it is realized that substantial differences exist for optimal preparation of the substrates surfaces with different crystallographic orientations. In the case of an AlN substrate, it is realized that the Al-terminated, c-face is not reactive with water, but the N-terminated c-face is reactive with water, along with non-polar faces. During wet lapping and polishing, the Al-polarity face tends to chip under the same conditions that are well-suited to mechanically polish the non Al-polarity faces and for Al-polarity faces where the c-axis is oriented 20 degrees or more away from the surface normal of the substrate. (Effectively, wet mechanical processing used on orientations other than the on-axis c-face is actually a chemical mechanical processing with a fixed abrasive). According to one embodiment of the invention, dry grinding and polymer diamond suspensions are used to prepare the Al-polarity side of c-face substrates that are close to on-axis (misorientation less than approximately 20°). Even under strictly mechanical polishing, the removal rates observed for the on-axis, Al-polarity surface is lower than for all other crystal orientations.

According to one embodiment of the invention, it is realized that the amount of material that should be removed during the mechanical processing prior to fine mechanical polishing and CMP depends upon quality of the saw cut. Typically between 50 and 100 µm must be removed to level the irregular cut of the saw for an annular saw. At this point, the sample is generally planar and should have a low pit density, and the sample may be subjected to fine mechanical processing. In this step, it is realized, according to one embodiment, that planarity of the samples be brought to the highest level for c-face, Al-polarity substrate surfaces, because it is realized that any exposed off-axis material will lead to undercutting of the desired surface during CMP. For non-polar surfaces, the high chemical reactivity allows planarization during CMP (few microscopically viewable pits and scratches are allowable and does not cause the CMP undercutting effects on the Al-polarity surfaces. Fine mechanical processing generally involves a measured removal totally between 10 and 20 µm of sample thickness.

According to one embodiment of the invention, it is realized that the removal rate during CMP is very much a function of the crystallographic orientation of the substrate surface. For the Al-polarity, c-face substrates, the removal rate increases from around 1 µm per hour to over 10 µm per hour as the angle between the surface normal and the c-axis is increased from near zero to over 20°. For the non-polar and N-polarity, c-face surfaces, the removal rate is mechanically limited by the abrasive particles in the slurry.

EXAMPLE

FIG. 1 shows a conventional CMP apparatus that may be used to polish substrate surfaces in a CMP process according to one embodiment of the invention. A wafer 101 to be polished is mounted on a wafer carrier 102 which generally includes a backing film 109 positioned between wafer 101 and a chuck 108 which holds the wafer and the wafer carrier 102. Wafer carrier 102 is rotated by a spindle 105. A force is applied to the wafer carrier 102 to contact the wafer 101 with one or more polishing pads 103A-103B. The one or more polishing pads 103A-103B are adhered to a platen 106 which also rotates. Further, a slurry 107 is applied to the pad 103A-103B and the drip rate is controlled, for example, by a control flow dispenser (not shown).

It should be appreciated that other CMP tools and/or polishing apparatus may be used and the invention is not limited to any particular CMP tools or polishing configurations.

According to one aspect of the invention, the CMP process may involve polishing the substrate using a slurry, the slurry comprising an abrasive suspension in a solution such that the slurry is capable of etching the substrate surface and creating a finished surface suitable for epitaxial growth. For example, a silica suspension in a solution may be used. This solution may be, for example, a hydroxide (basic) solution. Such a slurry is available commercially, for example, as the KOH-based CMP slurry known in the art as SS-25 (Semi-Sperse 25), available from Cabot Microelectronics or the Syton slurry available from Monsanto.

According to one embodiment of the invention, it is realized that a higher pH KOH slurry works better for the Al-polarity, c-face surface. The SS25 slurry has a pH of 11.0. Its high pH distinguishes it from other commercially available KOH slurries (like Syton and Glanzox) which have lower pH. For the on-axis Al-polarity, c-face surface, it is realized, according to one embodiment of the invention, that the pH should be over 10.5 to obtain observable removal rates.

It should be appreciated that other slurry types may be used. For example, diamond, silicon carbide, or other material may be used in a slurry. Also, other commercially-available slurries are available (e.g., SS-25-E and SS-225 (ammonia hydroxid-based) both of which are available from Cabot Microelectronics, AM 100 and Rodel 2371 (ammonia-based slurries)).

Such chemical/mechanical polishing methods are particularly suitable for preparing very hard surfaces, such as aluminum nitride (AlN) surfaces. It should be appreciated that various aspects of the invention reduce an amount of impurities and surface defects introduced into the AlN crystal substrate by the polishing procedure.

Figure 2:
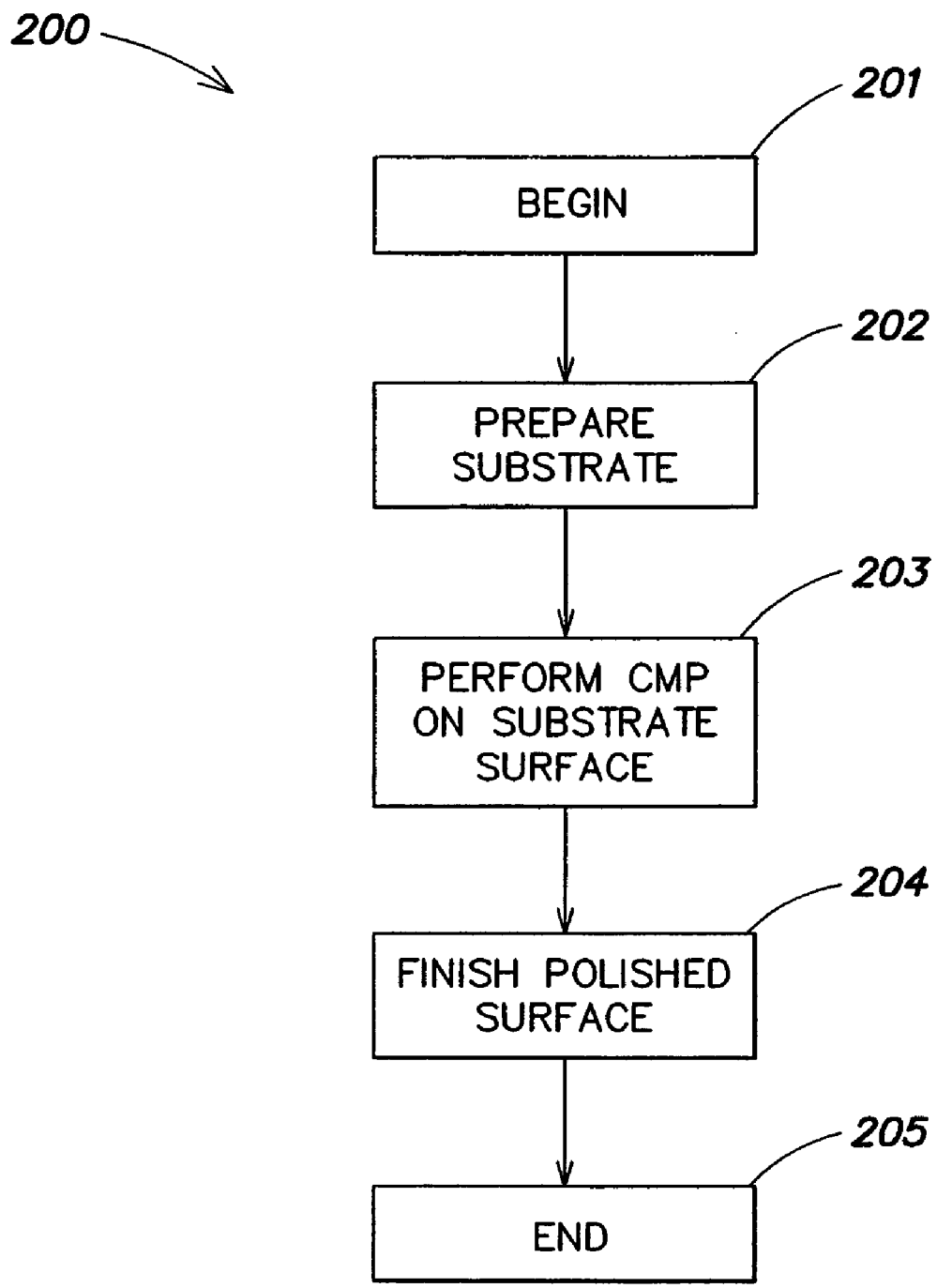
FIG. 2 shows a flow chart of a process used to polish a substrate surface according to one embodiment of the invention.

FIG. 2 shows a process 200 for polishing a substrate according to one embodiment of the invention. At block 201, process 200 begins. At block 202, the substrate is prepared for polishing. This may include removal of contamination from the surface of the substrate, the polishing apparatus and environment. Such contamination is generally responsible for the introduction of surface defects during the polishing process. At block 203, a CMP process is performed on the substrate surface. In the case of AlN, the CMP process may include polishing the surface using a slurry having a hydroxide solution. For example, the SS-25 slurry available from Cabot Microelectronics may be used. It should be appreciated that the invention is not limited to the type of slurry, and that other appropriate slurries may be used as discussed above. At block 204, the polished sample is finished. This may involve, for example, removal of the sample from the polishing apparatus and carefully cleaning the sample to remove any reactive agents introduced by the polishing process. At block 205, process 200 ends.

Figure 3:
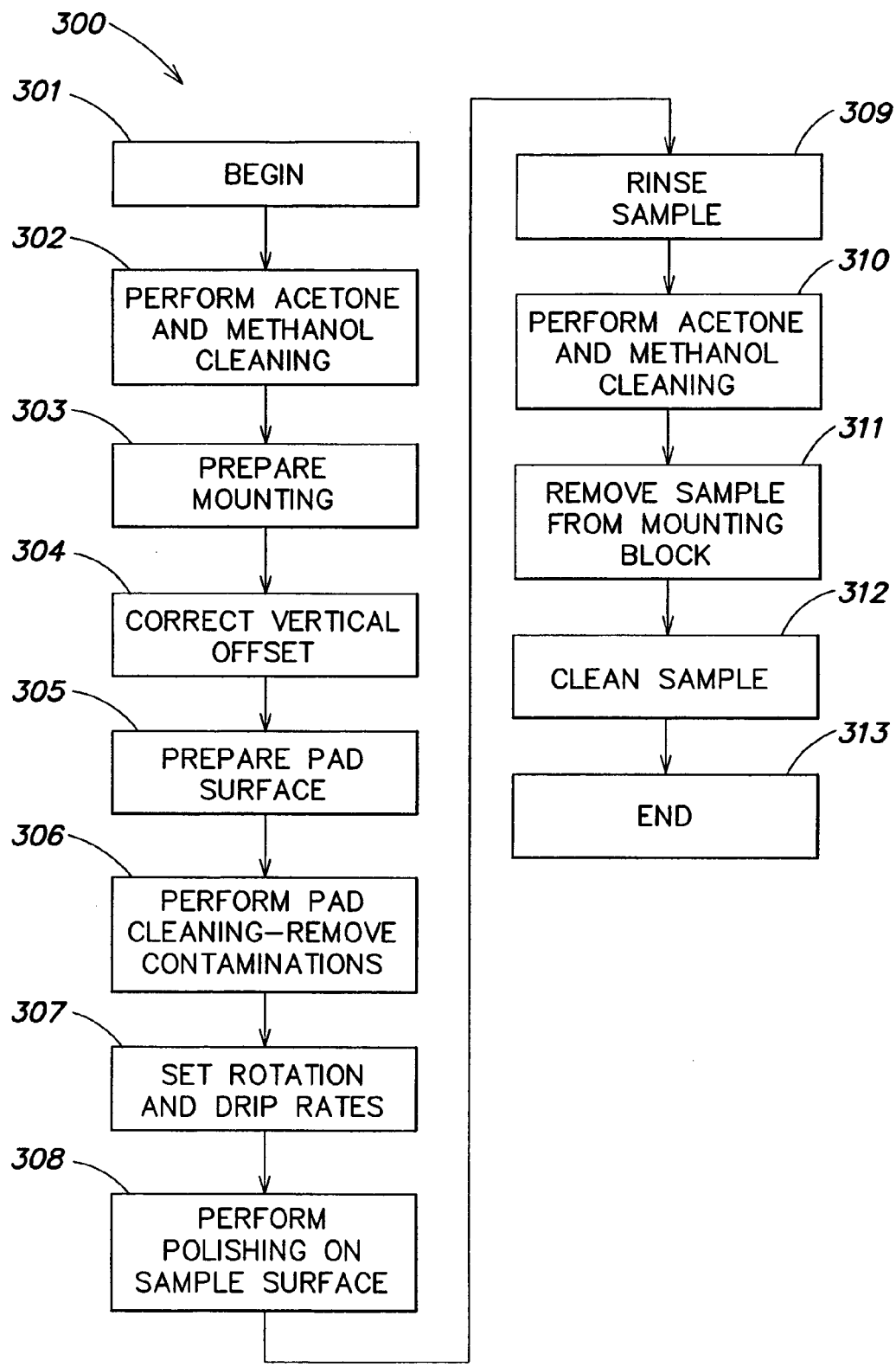
FIG. 3 shows a more detailed process for polishing a substrate surface according to one embodiment of the invention.

FIG. 3 shows a more detailed process 300 for polishing a substrate according to one embodiment of the invention. At block 301, process 300 begins.

According to one embodiment of the invention, the AlN substrate is prepared for a CMP process. More particularly, the environment and wafer are cleaned of possible contaminants, and the polishing apparatus adjusted to apply the correct polishing force to the wafer. The following example is a procedure for preparing the substrate according to one embodiment of the invention:

I. Preparation of Substrate and Apparatus for CMP Process

1. The sample surface and mounting block should be cleaned of substantially all possible contamination particles (e.g., wax, dirty, and larger mechanical grit particles). This is typically done with, for example, organic solvent (e.g., by acetone and/or methanol) cleaning performed at block 302. Also, any remaining particles from previous processings (e.g., CMP fluid residue) should be cleaned from all surfaces that contact the polishing area so as to reduce the likelihood of contaminating the polishing surface and potentially damaging the substrate surface.

2. The mounting block is then prepared to hold the sample at block 303. For example, the sample may be adhered to a surface of the mounting block. The mounting block is then switched from the "mechanical" process fixture to the "CMP" process fixture. According to one embodiment of the invention, these fixtures may be identical items; their use may be segregated to avoid cross contamination between the mechanical and chemical mechanical polishing.

3. The mounted sample may have the vertical offset corrected to allow the sample appropriate contact with the polishing surface. A mass to ensure proper down force can be added to the block at 304. Pressure in a range of $5\times10^5$ to $7\times10^5$ N/m$^2$ have been shown to be suitable. These are conditions that have yielded the most consistent results for both non-polar and polar faces. However, it should be appreciated that the invention is not limited to any particular set of conditions.

According to one embodiment of the invention, a CMP process may be performed on the prepared substrate surface. In one aspect of the invention, SS-25 (Semi-Sperse 25) slurry available from the Cabot Microelectronics Corporation may be used to polish an AlN substrate.

II. CMP Process

The following is a detailed sequence of steps, according to one embodiment of the invention, to prepare an AlN substrate surface and the drip rates for a CMP process according to one embodiment of the invention.

A new "Multitex 1000" fine polishing pad or any other suitable fine polishing pad should be applied to the polishing table (platen). Generally, such a polishing pad has a self-adhesive backing to adhere it to the platen surface. At block 305, the polishing pad is adhered to the platen surface. For best results, the polishing pad should be applied to the polishing deck in such a way to ensure that the pad is not placed with space behind the pad causing it to be uneven. For example, the polishing pad may be rolled onto the table from the lead edge to the other side with a cleaned rod so that spaces behind the pad can be avoided.

At block 306, the pad surface may be cleaned. For example, the pad may be cleaned with distilled water, saturated with water and the empty pad and platen surface rotated (e.g., 45-60 RPM or 13 to 18 m/sec in the sample path) on the pad for 10 to 15 minutes. During this cleaning process, the sample (with the substrate to be polished) should be lifted out of contact with the polishing surface. During this time, the surface of the pad should be thoroughly rinsed with filtered distilled water. This is performed to ensure that both the pad and the fixture have been completely cleaned of all dust and cross-contaminated particles.

At block 307, the slurry drip rate and rotation of the fixture should be set for polishing. During this rotation cleaning of the surface, the drip rate should be set using an appropriate flow control dispenser. The rate that has yielded the best and most consistent polishing results has been 3 drops of SS-25 slurry and distilled water per minute (approximately 0.5 mL/minute of each of the CMP fluid and distilled water for a circular 8.0" diameter polishing surface). It should be appreciated, however, that the invention is not limited to any particular drip rate, and that drip rate depends on the type of slurry used, pressure applied to the sample, and rotation speed. With this average drip rate set, the SS-25 slurry should be allowed to drip onto the polishing surface allowing the lapping fixture to evenly spread the solution and fill the sample area with a consistent level of abrasive particles and reactive solution prior to polishing the substrate surface. The polishing pad may be preconditioned in this manner prior to polishing for approximately 30-60 minutes or any other appropriate time to allow for substantially even distribution of slurry and etchant over the surface of the pad.

Following the proper rate confirmation and with the observation of proper rotation of the fixture, then the sample may be lowered on the surface to begin the CMP process. At block, 308, the sample is polished.

Although a typical process time (polishing time) for this step is approximately 1 hour, a process time in a range of 5 minutes to 100 hours has been shown to adequately polish a surface. It should be understood that the invention is not limited to a particular process time, but rather, the process time range is provided by way of example.

Although the material removal depends highly upon the crystal quality and the orientation of the sample, common values range from 0.1 µm (Al face c-axis) to 60 µm (N face c-axis) for 1 hour processing.

According to one embodiment of the invention, the sample is cleaned to remove any contamination from the CMP process, and to remove traces of reacting chemicals from the substrate surface to stop any residual reactions with the substrate.

III. Finishing

1. At block 309, the sample is rinsed. At the end of the CMP process, the sample should be lifted from the polishing surface and immediately rinsed, for example, with distilled water. This is performed to ensure that the reaction between the AlN and any of the active ingredients in the slurry be stopped, and to remove abrasives that may dry to the prepared surface.
2. Following this rinsing, the sample is carefully cleaned at block 310 with suitable organic solvents to remove the agent bonding the substrate to the substrate holder. Mounting waxes soluble in these solvents and other common sample holding techniques may be used to hold the substrates, as well as other adhesive film and vacuum chucking techniques. Each of these holding techniques may need different substrate debonding procedures at block 311, as is well-known in the art.
3. Following the CMP processing, the sample surface should be cleaned very well at block 312. For example, the sample surface may be cleaned prior to removal of the sample from the mounting block, and then the entire sample may be cleaned when removed.
4. At block 311, process 300 ends.

Figure 4:
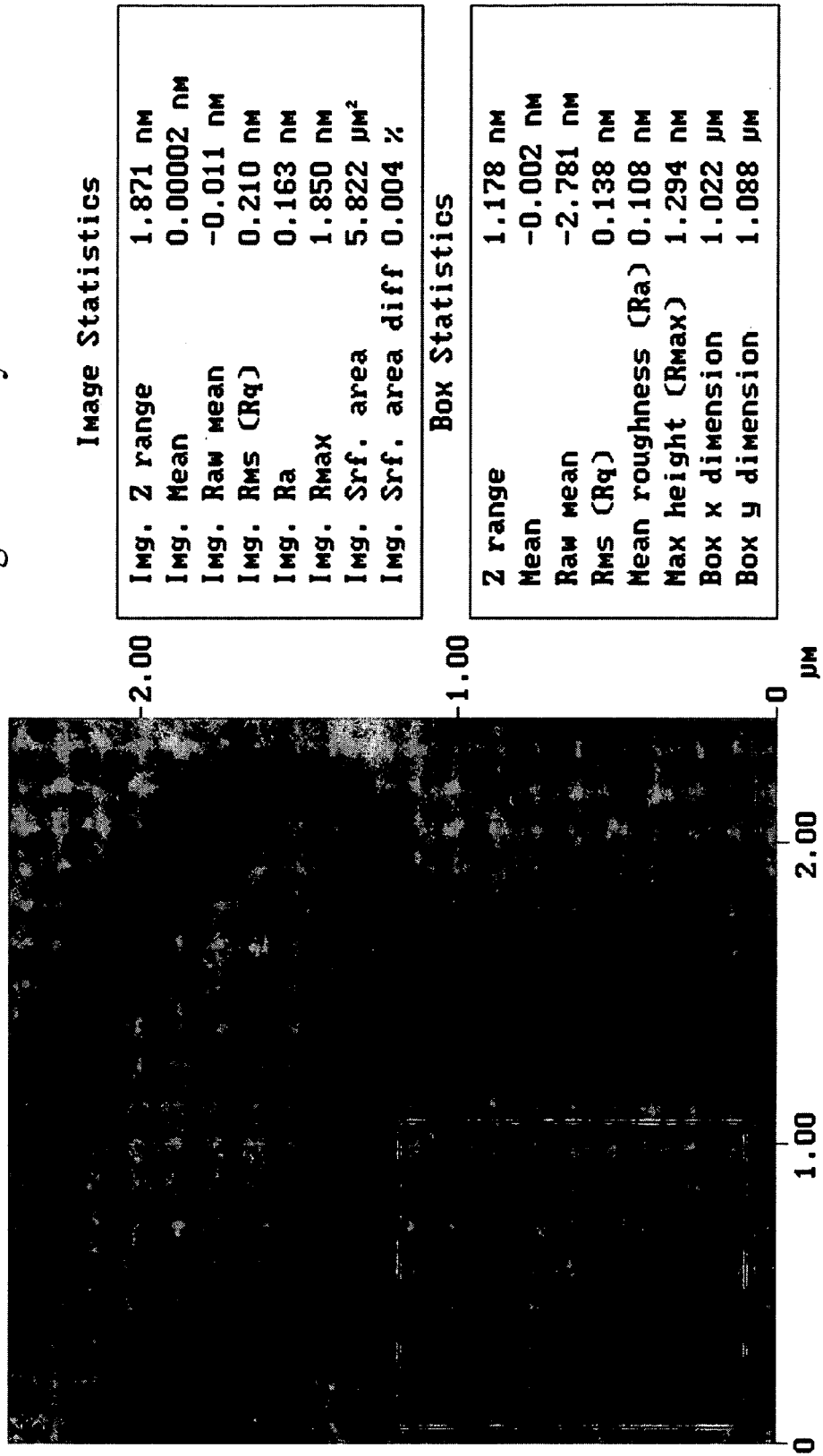
FIG. 4 shows an AFM image of an Al-polarity c-face of an AlN substrate after performing CMP polishing according to one embodiment of the invention.

FIG. 4 shows an AFM image of the Al-polarity of the c-face substrate after polishing according to one embodiment of the invention. The substrate surface is oriented with its normal approximately 5° off the direction of the c-axis. It can be seen that the surface is nearly atomically flat. Analysis of a wider area shows that all mechanical damage has been removed. Similarly smooth surfaces may be obtained for the N-polarity of a c-face substrate.

Figure 5:
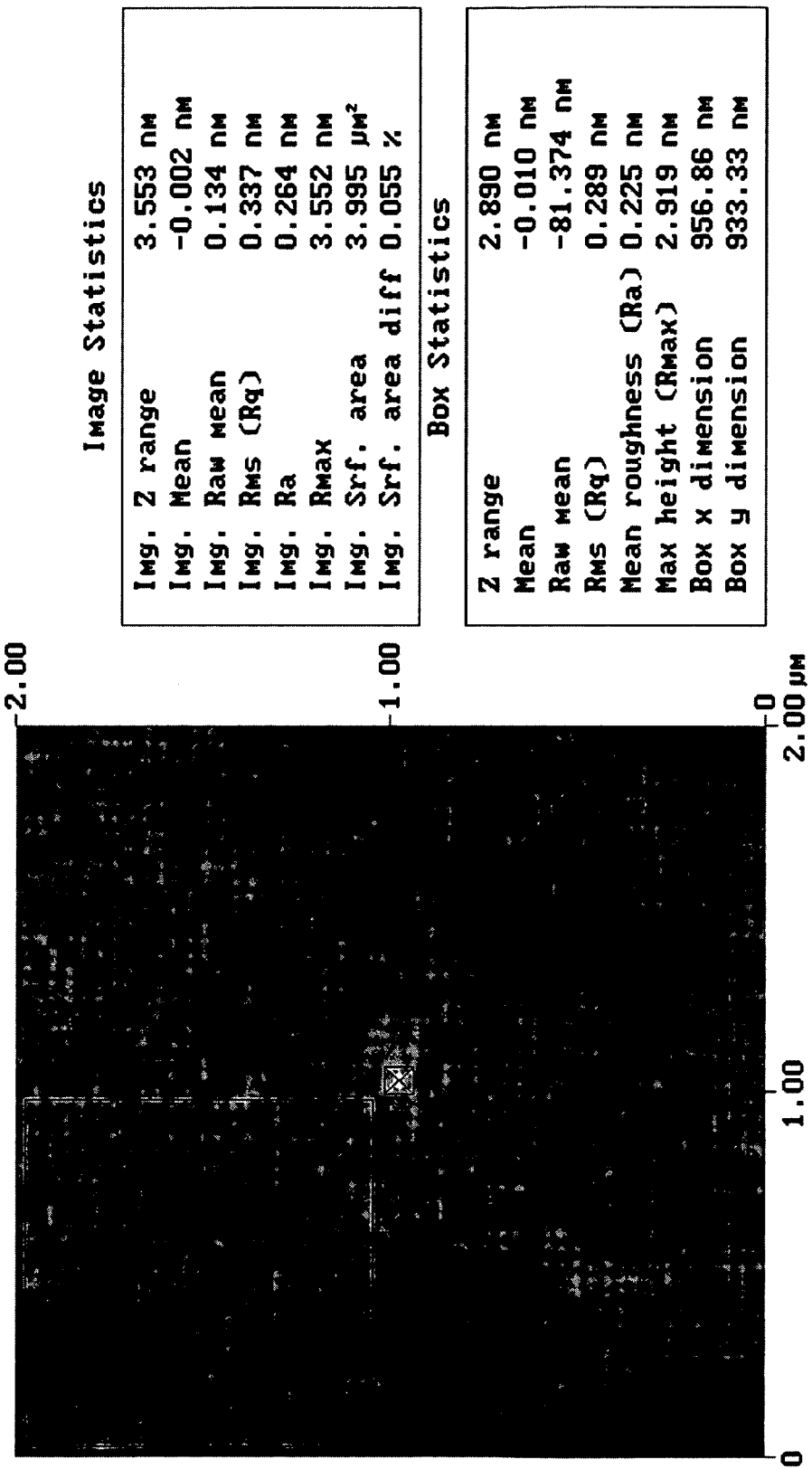
FIG. 5 shows an AFM image of an AlN substrate surface tilted 45 degrees with respect to a c-axis direction of the AlN substrate, the surface pictured after performing CMP polishing according to one embodiment of the invention.

FIG. 5 shows an AFM image of a substrate after polishing according to one embodiment of the invention. The surface is tilted 45° with respect to the c-axis direction. As can be observed, the substrate surface is nearly atomically flat. Evidence of mechanical damage has been removed. The crossed box on the center was eliminated from the image for the statistical analysis.

Having described several embodiments of the invention in detail, various modifications and improvements will readily occur to those skilled in the art. Such modifications and improvements are intended to be within the spirit and scope of the invention. Accordingly, the foregoing description is by way of example only, and is not intended as limiting. The invention is limited only as defined by the following claims and the equivalents thereto.

What is claimed is:

1. A method of preparing a surface of a single-crystal aluminum nitride (AlN) substrate, the method comprising the acts of:

preparing the surface of the single-crystal AlN substrate for a chemical mechanical polishing (CMP) process;

performing the CMP process on the surface of the single-crystal AlN substrate; and finishing the surface of the single-crystal AlN substrate, wherein the act of performing the CMP process comprises applying an abrasive suspension in a solution consisting essentially of a hydroxide during the CMP process.

2. The method according to claim 1, wherein the solution has a pH value greater than approximately 10.5.

3. The method according to claim 1, wherein the abrasive suspension in the solution comprises silica.

4. The method according to claim 1, wherein the hydroxide comprises KOH.

5. The method according to claim 1, wherein the hydroxide comprises ammonia hydroxide.

6. The method according to claim 1, wherein preparing includes cleaning a polishing apparatus prior to polishing the surface of the single-crystal AlN substrate.

7. The method according to claim 1, wherein finishing the surface of the single-crystal AlN substrate includes substantially rinsing the abrasive suspension from the surface of the single-crystal AlN substrate.

8. The method according to claim 1, wherein preparing the surface of the single-crystal AlN substrate comprises cleaning the surface of the single-crystal AlN substrate with a solvent.

9. The method according to claim 1, wherein the surface of the single-crystal AlN substrate is non-polar.

10. The method according to claim 1, wherein the surface of the single-crystal AlN substrate is an Al-terminated c-face.

11. The method according to claim 1, wherein the surface of the single-crystal AlN substrate is an N-terminated c-face.

12. The method according to claim 1, wherein an angle between a normal of the surface of the single-crystal AlN substrate and a c-axis is less than 90°.

13. The method according to claim 8, wherein the solvent is organic.

14. The method according to claim 13, wherein the solvent comprises at least one of acetone or methanol.

15. The method according to claim 1, wherein the solution has a pH value greater than approximately 9.5.

16. The method according to claim 1, wherein the solution has a pH value greater than approximately 10.2.

* * * * *